United States Patent [19]

Wiebach et al.

[11] Patent Number: 4,903,018

[45] Date of Patent: Feb. 20, 1990

[54] PROCESS FOR COMPRESSING AND EXPANDING STRUCTURALLY ASSOCIATED MULTIPLE-DATA SEQUENCES, AND ARRANGEMENTS FOR IMPLEMENTING THE PROCESS

[75] Inventors: Heinz-Ulrich Wiebach, Friedrichsdorf; Reinhard Lidzba, Frankfurt, both of Fed. Rep. of Germany

[73] Assignee: Heinz-Ulrich Wiebach, Friedrichsdorf, Fed. Rep. of Germany

[21] Appl. No.: 40,772

[22] PCT Filed: Jul. 16, 1986

[86] PCT No.: PCT/DE86/00289

§ 371 Date: May 18, 1987

§ 102(e) Date: May 18, 1987

[87] PCT Pub. No.: WO87/00714

PCT Pub. Date: Jan. 29, 1987

[30] Foreign Application Priority Data

Jul. 19, 1985 [DE] Fed. Rep. of Germany ....... 3525898

[51] Int. Cl.[4] .............................................. H03M 7/38
[52] U.S. Cl. ........................................ 341/51; 341/90; 382/56; 358/261.1
[58] Field of Search .................. 340/347 DD; 382/56; 358/260, 261; 364/200, 900; 341/50, 51, 86, 90

[56] References Cited

U.S. PATENT DOCUMENTS 3,521,241 7/1970 Rumble .................... 340/347 DD X
4,077,034 2/1978 Dell ............................. 340/347 DD
4,319,225 3/1982 Klose ........................... 340/347 DD Primary Examiner—William M. Shoop Jr.
Assistant Examiner—Gary J. Romano
Attorney, Agent, or Firm—Varnum, Riddering, Schmidt & Howlett

[57] ABSTRACT

A process and data processing system are disclosed for compressing and expanding structurally associated multiple data sequences. The process is particular to data sets in which an analysis is made of the structure in order to identify a characteristic common to a predetermined number of successive data elements of a data sequence. In place of data elements, a code is used which is again decoded during expansion. The common characteristic is obtained by analyzing data elements which have the same order number in a number of data sequences. During expansion, the data elements obtained by decoding the code are ordered in data series on the basis of the order number of these data elements. The data processing system for performing the processes includes a storage matrix (26) and an index storage (28) having line addresses of the storage matrix (26) in an assorted line sequence.

37 Claims, 8 Drawing Sheets

FIG. 1

PROCESS FOR COMPRESSING AND EXPANDING STRUCTURALLY ASSOCIATED MULTIPLE-DATA SEQUENCES, AND ARRANGEMENTS FOR IMPLEMENTING THE PROCESS

DESCRIPTION

Technical Field

The invention relates to a process for compressing and expanding structurally associated multiple data sequences, particularly data sets (records) in which data sequences to be compressed are stored in parallel in a storage matrix on the basis of their structural association, performed for obtaining a characteristic connecting a number of data elements of the data sequences for multiple data sequences as structural analysis of data elements of conforming ordinal numbers, a code is used instead of these data elements and, during expansion, the data elements obtained by decoding the code are arranged in data sequences on the basis of the corresponding data element ordinal number. The invention relates further to data processing systems for implementing the process.

BACKGROUND ART

Data sequences are often redundant to a high extent, i.e. they contain a basically higher number of data elements or signs than are necessary for representing the information they contain at the time. An example for this is the regularly constructed data sets (records) for files pertaining to the economy and to the administration. A further example of this is the transmission of TV pictures in which the subsequently taken and then as data sequences stored or transmitted partial images, relative to individual areas of a scene, are identical, since they were not exposed to any change relative to their position, light intensity or color of picture points (elements). This is the case for the majority of picture points without changing the scene. In order to be able to carry out the transmission of data sequences economically, it is necessary to compress them and to expand them again at the end of the transmission path (route).

Processes are already known in which the compression of data sequences is made by means of a coding of variable length. The coding diagram of this type effects that the bit strings of a fixed predetermined length are coded in bit strings of variable length, and bit strings of the often occurring code words are represented shorter than code words of a fixed predetermined length. This conversion of code words of a fixed length into code words of variable length is known as Huffman-coding. In case of a meaningful allocation of code words of variable length with the given data, a considerably slighter length of such code words will then result in comparison with the respective code words of a predetermined fixed length, though many code words of variable length are considerably longer than the corresponding code words of a fixed length.

Furthermore, processes for compressing and expanding data sequences are known in which a structural analysis is applied, in order to recognize in a predetermined number of data elements of data sequences a characteristic that connects them. Such a characteristic can be, for example, in a repeated occurrence of the same sign or can be given also in an increasing numerical character string of the type 1, 2 . . . . The given number of data elements is converted then into a code. Such a code in a string of signs equal to n should contain at least a separating sign, the respective sign and the number of its occurrence, in order to be able to produce again the original string during expansion.

Further known is a process for compressing and expanding data sequences in which two logically associated data sequences are interlinked by an EXCLUSIVE-OR before the compression proper of the usual type. This logical interlinkage (combination) effects that zeros are produced on the points on which equal signs are present. Since the data sequences are presumably logically associated by EXCLUSIVE-OR association, a data sequence is produced which often contains zeroes as data elements. The data sequence strongly interspersed with zeroes is then compressed in the usual manner.

The structural association, especially the logic association of at least two data sequences for the purpose of compressing, is used in this process in order to improve the result of compressing. However, even in this process, the result of compressing is still strongly redundant. Besides, a high technical circuitry expenditure is necessary for the realization of this process, since universal computers of high efficiency are required.

The same is true for a process of the initially mentioned type that is known from the article "Data Compaction for Improved Transmission Efficiency" by Dirk R. Klose in *IEEE National Telecommunications Conference*, of Nov. 26 to 28, 1973, pp. 35C-1 to 35C-6. In this process, several data sequences of a predetermined length, forming together a data set, are arranged line by line in a matrix and compressed by coding column by column into less redundant code sequences, so that their structural association is set in the direction of the columns and evaluated. Although it is possible to improve the result of compression in this manner, the expenditure of the technical circuitry, nevertheless, remains high, especially when considering the matrix-like data sequences arranged column by column.

SUMMARY OF THE INVENTION

Therefore, it is the task of the invention to act upon the data sequences by compressing and expanding several structurally associated data sequences, especially data sets, in a manner so clearly improved in comparison with the heretofore applied processes that it can be realized with a considerably smaller expenditure for technical circuitry than was necessary heretofore.

This task is solved according to the invention, starting with a process of the initially mentioned type, so that, before the structural analysis, the stored data sequences are examined relative to their length, formed with data sequences of data sequence groups of equal length, and the data sequence groups are arranged according to an increasing or decreasing length.

By the particular procedural step, executed according to the invention before the structural analysis, it will be possible to consider in the structural analysis to be executed step by step in compressing the data elements only that part of the actual matrix column in which information is available due to the foreseen order of the data sequence groups. Thereby it is possible to considerably reduce the expenditure for the time of processing and thus of the techniques of circuitry. The result of compressing will be simultaneously improved, since the ordering of the data sequence groups according to their length prior to execution of the structural analysis enables a comprehensive view of adjacent matrix columns of equal or of almost equal length, whereby matrix columns of a code sign, characterizing such a group, are saved. It has been demonstrated that in an order of the data groups of this type even other common features of adjacent matrix columns are easier to be evaluated and can lead to a shortening of the code words in the outcome of the compression.

When organized data sequences of equally effective length and of equal characteristics are organized according to increasing or decreasing storage matrix line number, in order to maintain as far as possible the structural association of the data sequences read into the storage matrix line by line, the result of compressing can be thereby furthered.

In this process, it is possible to characterize advantageously the effective data sequence length, at least one data sequence characteristic and the storage matrix line number by an attribute field that completes each data sequence. It is then possible to have easy access to the order criteria.

In a further realization of the process according to the invention, the individual data sequences are serially precompressed in order to use the structural association given by considering serially the data elements of the individual data sequences. If possible, the structural reference points for the column by column compression is not to be destroyed by this process. This is obtained so that the compressed strings are replaced in the data sequence by fill characters which are not considered during the compressing column by column proper. The structure of the individual data sequences remains thus maintained.

As one possibility of the serial precompression, the at the time last data element of at least one data sequence, as well as eventually the number of such data element and their repetition factor is taken over into the attribute field. Furthermore, for shortening, the last data element, as well as its precursors, identical in the data sequence with the former, are eliminated. This type of serial precompression proves to be particularly advantageous, since the last data elements of a data sequence are often identical. Let us consider here, for example, empty characters, called blanks, at the end of the data sequences.

In case that the type of data sequence is not explicitly indicated, it has proven to be advantageous to take over into the attribute the last and the before last data element of the uncurtailed data element as a data sequence characteristic and to eliminate it in the data sequence. This is based mainly on the understanding that structurally similar data sequences, as far as to their data elements at the end of the data sequence, are identical.

The result of compression can be further improved when within the framework of serial precompression of the data sequences at least the character string of a data sequence, consisting of equal data elements, is eliminated and replaced by fill characters, and when this string is written in a descriptor field provided for each data sequence separately by an index, marking the beginning of the character string, by the length of the character string and the first character sign. By this measure, it is possible to compress most effectively long character strings of identical data elements without destroying thereby the structure of the individual data sets, since the eliminated character strings are replaced by fill characters which are not considered in the column by column compressing process.

Since the jittering (flowlike arrangement) of blanks or zero characters, for example, effects negatively the compression result in the process of compressing column by column, at least the greatest jittering of such interference characters in the data sequences to be compressed is determined within the framework of the serial precompression. The interference characters are replaced by fill characters and the interference character itself is inscribed (written upon) by a jittering index marking the beginning of the interference field, by the length of field and by the first interference character.

Since all measures described within the framework of serial precompression, as well as the sorting of data sequences based on various criteria, are unequivocal processes, they can be cancelled within the framework of expansion.

In a further design of the process according to the invention, at any time at least one column descriptor field is foreseen for each data element column that is at least partly written in the data element column. According to a further development of the invention it is therefore possible, for example, to eliminate the data element columns, consisting of identical characters (signs), to replace them by fill characters of the actually replaced characters and to inscribe them in the respective descriptor fields by an indication of the actually replaced character. By inserting the fill character instead of the eliminated data column, the structure of the individual data sequence remains maintained, since the field characters are bypassed in the process proper of compressing column by column.

According to another further development of the invention, at least the longest character string of a data element column, consisting of equal data elements, is eliminated and replaced by fill characters. This character string is further inscribed in the actual column descriptor field by an index marking the beginning of the character string, by the length of the character string and by the first character. By this inscription of the character string, it is possible to reproduce it within the process of expansion and arrange it on the proper spot in the data element column.

In another further development of the process according to the invention, at least the longest character string of a data element column, consisting of identical data elements, is recoded into a shorter code word in comparison to the respective character string and is replaced by this code word and the data element spots emptied by this operation are filled by fill characters.

In a further advantageous development of the process according to the invention, two neighboring character strings of a data element column are interchanged and are stored into the contact point of the character strings in the index, marking their original position and the lengths of the character strings in the descriptor field of the respective data element column.

In a further development of the process according to the invention, the data elements of at least a part of a data element column in one for this respective column specific, less redundant code, are recoded whereby the result of compression can be further improved.

As a further measure for improving the result of compressing serves the linkage of the individual data elements of the data element column by the logical function with the truth table "A linked with B=W" in case that A=B and "A linked with B=B", in case that A≠B on condition that B≠W, where W is any selected repetition character, for example the zero character.

The application of this logical function for the data elements of a data element column serves for the homogenization of these data elements. In case of a comparison of the data element B with the data element A where the equality of B and A is determined, the data element B is replaced by the repetition character W. On the other hand, in a comparison of the data element B with the data element A where the inequality of B and A is determined, the data element B remains unchanged. When this logical function is subsequently applied for the data elements, for example in the data element column from below upward, it will be possible, for the sake of a one to one correspondence of the logical function which is valid for the condition that B≠W, to restore during expansion the data element column with the original data elements. After application of this logical function of the data elements of all data element columns, the linkage results of two data sequences can again be always serially compressed.

In a further design of the process according to the invention, each data element of a data element column is recoded into a valuation or indicator code word, in case that the indicator code words of the individual data elements are added bitwise to the data element column, adjacent indicator code words bitwise EXCLUSIVE-OR are linked, the linkage results are also added and both additional results are evaluated for the classification of the data structure. In this case, the individual bit positions of the valuation or indicator code words have logical power over the type of the actual data element. It is thus possible that, for example, a 1 in the fifth bit position of a valuation or indicator code word signifies that the first half character of the respective data elements is 0. By the bitwise addition of the indicator code word of the individual element of a data element column the logic is obtained stating how many data elements are available in the date element column which have their first half character 0. By the bitwise EXCLUSIVE-OR linkage of adjacent indicator code words and by the addition of the results of the linkage, a logic is obtained relative to the frequency of the type of the individual data elements, whether they are especially suitable for evaluating the classification of the data structure.

Since the probability of a half characterwise confirmity, or at least a common characteristic of the half characters of half elements of a data element column, is greater than in a complete data element, the result of compressing can be improved when each data element column is converted half characterwise into a kind of code word determined by the result of the classification.

This is done in a simple manner so that the result of the classification is expressed by m-bits which are formed from the m-bit classification result, together with an n-bit half character, comprising an (m+n) for addressing a code memory containing the code words, and the addressed code words are read out one after another from the code memory. By this operation, a storage range of the code storage is selected, containing the part of the address of a higher value, comprising suitable code words for the occurring half characters for the respective, by the higher result of classification expressed data structure of the data element column.

In a further development of the process, both code words, read out at any time as the last ones from the code storage, are examined as to their confirmity after each reading cycle of the code storage. This makes it possible to sum up and thus to compress in this way subsequent equal code words in a further step of the process.

This takes place in a further development of the invention so that the number of the directly subsequent reading cycles of the code storage are counted, after which both code words, read out as last from the code storage, always correspond. The result of counting indicates then how often the type of the last from the code word read out from the code storage has subsequently occurred.

A further development of the process according to the invention is characterized in that the counting result is interlinked in dependence on the type of the code words so that the interlinked result of counting is discernible from the respective code words. This interlinkage serves for a safe differentiation of the counting result from the code words occurring in the code storage.

In a further development of the process according to the invention, the half characters, occurring preponderantly in a data element column, are represented only once, and each one of the remaining half characters, as well as one index indicating the actual position of this remaining half character, are separately represented in the code of compression. This type of compression is especially suitable for widely homogenous data element columns interspersed by a few interfering characters only.

A data processing system for realizing the process is built according to a further development of the idea of the invention so that a storage matrix is provided on its address inputs with a first switchover device by which, in dependence on a first switchover signal, the line and column addresses of the data element storage positions are interchangeable. By this interchangeability of line and column addresses only will it be possible to make the storage matrix readable linewise as well as columnwise, and rewritable without the need of expensive randomizing (conversion) of addresses requiring high computer power. Since the addressing of a storage matrix of order sets of conventional data processing systems is provided only linewise, the address of the subsequent data element in the data element column had to be computed heretofore in a column by column processing, before the desired counting operation could have been executed.

Furthermore, when an index storage is provided with its number of lines corresponding to those of the storage matrix, and having the line addresses of the storage matrix in an assorted sequence, it is possible to have an assorted access to the data element storage positions of a data element column of the storage matrix in accordance with the sequence of lines of the line addresses in the index storage without the need of a preceding expensive reassortment of the data element lines of the storage matrix. The actuation of the line address inputs of the storage matrix by the output signals of the index storage is advantageously done by a second switchover device controlled by a second switchover signal.

In a further development, an attribute and descriptor storage is foreseen with a third switchover device on its address inputs by which, in dependence on the third switchover signal, the line and column addresses of the storage positions are exchangeable. A separate attribute and descriptor storage, beside the storage matrix for the data elements proper, has the advantage that in further developments of the process according to the invention in which an assorting of the data sequences is made, these must be reassorted, not in their totality, but basically the contents only of the lines of the attribute and the descriptor storage dependent on the assorting criteria. Dependent on the attribute and descriptor storage, the executed reassortment is then loaded into the index storage so that the storage matrix proper can be addressed from them in an assorted way. In order to be able to address line by line, as well as also column by column without having to spend costly recounting of addresses, a third switchover device for exchanging the line and column addresses is foreseen on the inputs of the attribute and descriptor storages.

A decoder produced, for example, by one or more address bits of higher value of decoding the actual switchover signal, is advantageously provided for getting the actual switchover signal from the storage address.

According to a further development of the invention, a commercial multiplexer is foreseen as a switchover device.

The data processing system for realizing the process can be designed equally so that a reading storage, containing the indicator code words, is foreseen and is addressable by the data elements. A certain indicator or evaluation code word can thus be simply assigned to each data element type.

In a further development, a counter system is connected with the data output of the readout storage with a double number of individual counters in comparison with the bit number of the indicator code words and they are series connected to the half of the individual EXCLUSIVE-OR members the inputs of which have at times a bit position leading from the indicator code words directly adjacent in the readout storage. By such an indicator system, it can be determined how often the data elements of a data element column conform with the bit position and how many bit changes between adjacent data elements of a data element column are to be entered into an individual bit position. For determining the exchanges in the individual bit positions, two registers are advantageously foreseen between the data output of the readout storage and the inputs of the EXCLUSIVE-OR members, serving as intermediate storage of the actually last and the directly before last indicator code words read out from the readout storage. In case that contents of both registers correspond, it signifies that the actually last and the directly before last indicator code words read out from the readout storage are identical. On the outputs of the EXCLUSIVE-OR members of the individual bit positions appears then always the value of 0. However, should the contents of both registers not correspond in their individual bit positions, this signifies that in these bit positions a change took place between the actual last and the directly before last indicator code words read out from the readout storage. The value of 1 appears then on the outputs of the EXCLUSIVE-OR members of these bit positions.

The data processing system can be designed also by having a fixed data storage (read-only memory) as code storage that can be addressed from the data structure-classification result of the data column to be compressed and from the actual half character of the respective data column, and the data structure-classification result of the higher valued address part forms the higher valued address part and the actual half character of the low value address part. By the result of the data structure-classification, the storage range, relevant for the respective data structure of the code storage, is addressed in this manner, containing suitable code words for the half characters to be compressed.

A first and second register is connected in parallel to the code storage in a further development, so that the first register stores temporarily the actually last read out code word and the second register stores the directly before last code word. It is thus possible to obtain simple access to both code words read at any time from the code storage.

In a further development of the data processing system, a comparator circuit is advantageously foreseen, connected with the outputs of the first and of the second register, in order to determine by it the code words read always as the last from the code storage. Furthermore, a counter is foreseen, controlled by the comparator circuit, by which the number of the directly subsequent identical code words, read from the code storage, can be counted.

In order to be able to encode in a simple manner the count of the counter in dependence on the type of the code words, a multiplexer circuit is advantageously provided.

The data processing system is designed for the above described logic linkage of data elements so that an A-register and a B-register are foreseen, serving also as a result register so that the outputs of both registers are bitwise connected with the inputs of EXCLUSIVE-OR members and that outputs of the EXCLUSIVE-OR members are connected with the inputs of a disjunctive linkage the outlet signal of which controls the resetting (restoring) input of the B-register. This circuit arrangement is characterized by its simple design.

BRIEF DESCRIPTION OF THE DRAWINGS

The invention is nearer explained in the following with the help of an example of a typical data file and on the basis of examples of embodiments of a storage system, an indicator system, a half character compressing system, and a circuit arrangement for logical linkage of data elements in a data processing system.

These embodiments in accordance with the invention are described with respect to the drawings in which:

FIG. 1 is a file consisting of 37 data sets;

DETAILED DESCRIPTION

Figure 1:
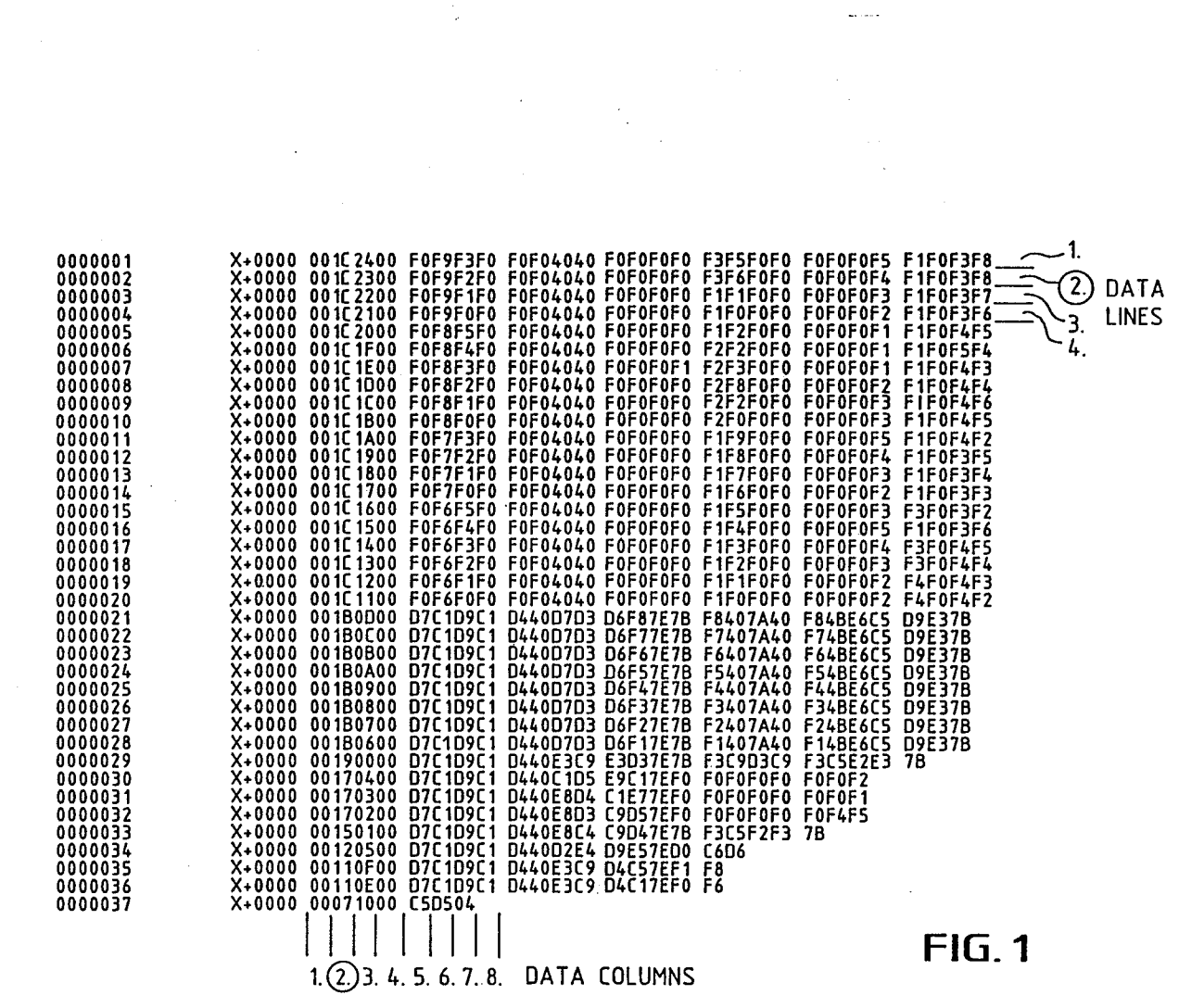

FIG. 1 shows a typical file consisting of hexadecimally represented data elements. The 37 data sets that it comprises are assorted according to their length. By means of this data file, it will be shown that the individual data elements, viewing the data sets column by column on the basis of their structural association, have greater common features among one another than if considered data set by data set or line by line.

Let further mention that a compression of identical characters for example, is meaningful only when these occur subsequently at least four times, since the compression code must contain a sequence of compressing characters indicating separating characters, the compressed character and the number of its occurrence.

Viewing, for example, in FIG. 1 the second data line, it is recognizable that the data element F0 occurs successively as a single data element, on the one hand, four times and, on the other hand, five times. Therefore, by compressing identical characters, three data elements could be saved in this data line, since basically the four and the five data element string can always be represented by three characters in the process of compression. On the other hand, considering, for example, the second data column of this data file, it can be seen that the data element 1C occurs successively twenty times and the data element 1B eight times. In the columnwise data-elementwise compression of identical characters, it is possible to save twenty-two ($=20+8-2\times 3$) data elements. Finding further data lines and data columns, and comparing their compression result, it will be seen that a columnwise data elementwise compression comparison to a linewise data elementwise compression leads, as a rule, clearly to a better result. When the columnwise compression of the data elements is realized even half characterwise, the compression result will further improve. Viewing again the second data column, it is observed that the half character or half byte "1" occurs successively altogether thirty-six times. A half character occurring successively with such a frequency, can be compressed with the highest efficacy.

Figure 2:
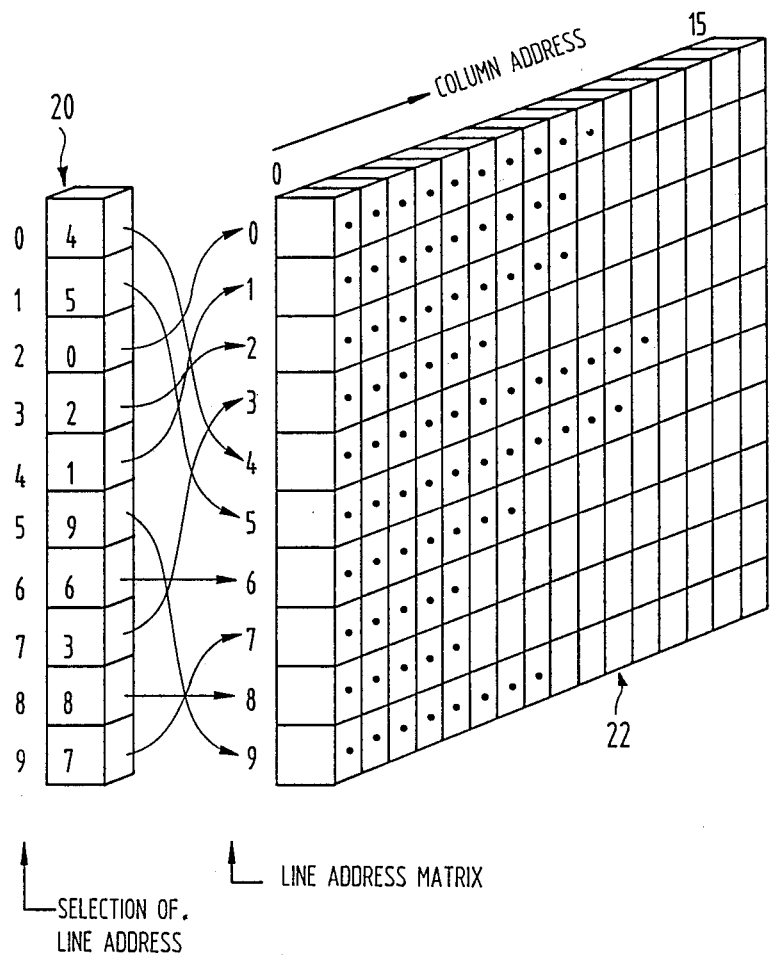
FIG. 2 is a diagram of an exemplary principle controlling a storage matrix by an index storage.

Since the data sets of a file are assorted as a rule not according to their length, and since it is appropriate for the columnwise compression of the data elements, when the individual data sets are arranged in order to avoid gaps of data elements with a degressive length from above downward in the storage matrix, it is necessary to rearrange the data sets containing data lines of the storage matrix or, in order to save processing time, to address the storage matrix in an assorted way. As shown in FIG. 2, this is possible by a line addressing by means of an index storage 20. The line addresses, contained in the index storage 20 of the storage matrix 22, holding the individual data elements, must basically be reassorted so that the line 0 of the index storage 20 contains the address of the line of the storage matrix 22 that holds the greatest numbers of data elements. The line 1 of the index storage 20 must then contain the address of the line of the storage matrix 22 that holds the second greatest number of data elements, etc. After having successively selected the index storage 20 and read from line 0 to line 9, the line addresses of the storage matrix 22, contained in the index storage 20, the individual lines containing the data sets of the storage matrix 22, will be addressed assorted on dependence of the length of the data sets.

Figure 3:
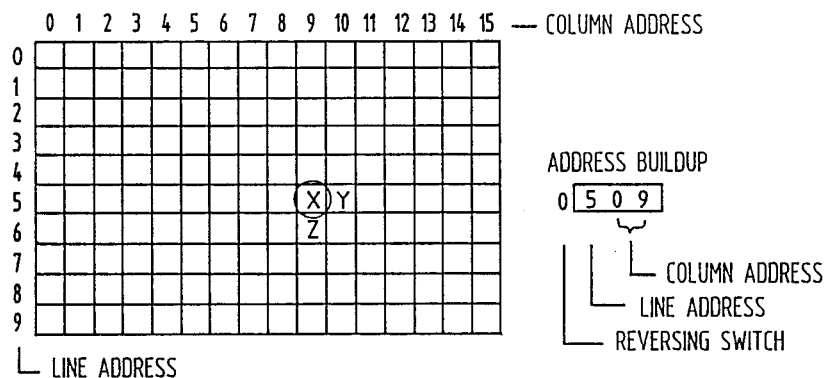
FIG. 3 is a schematic illustration of a storage matrix with two data elements arranged in a matrix line.

FIG. 3 shows a storage matrix consisting of ten lines and sixteen columns addressable with decimal addresses, and also its addressing diagram. As seen in FIG. 3, the data element X is addressed by the address 509. The address part of higher value, i.e. the digit 5 is the line address, and the low value address part, i.e. the digit sequence 09 is the column address. The digit 0, placed in front of the address 509, serves merely as a reversing switch and is not needed for the addressing proper of the data element X. Since, for the usual successive storage addressing, the address of the following data element ensues basically by increasing the digit of the storage address by 1, the data element Y that has the same line address as the data element X and the column address of which, in comparison to the column address of the data element X is addressed as the following data element, has a value that is higher by 1. The fact that in the successive storage addressing the data element Y is addressed in the same line after the data element X and not the data element Z in the same column, is explained so that usually the line address forms the higher value address part and the column address the low value address part that is then counted higher.

Figure 4:
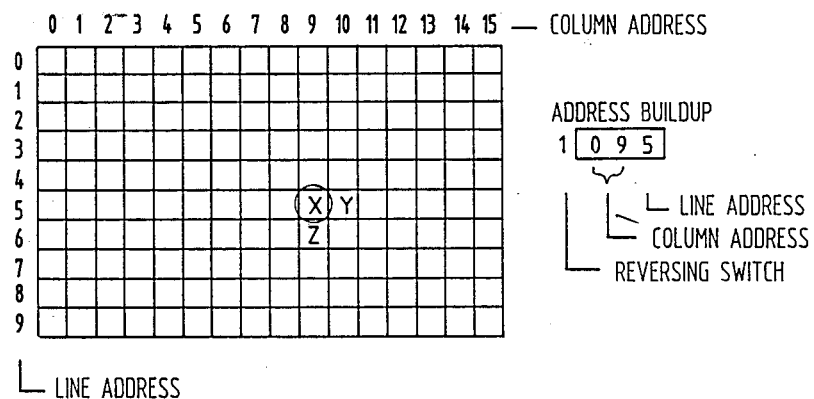
FIG. 4 is the storage matrix of FIG. 3 with two data elements arranged in a matrix column.

If, on the other hand, in a successive storage addressing, after the data element X is the next data element Z, i.e. as first addressed is the data element of a column, it becomes necessary that the storage matrix be addressed with an address in which, as shown in FIG. 4, the line address is substituted by the column address. When the column address 09 forms the address part of higher value and the line address 5 the address part of a lower value, then the line address is counted higher. With the digit of the address raised by 1, the line address of a value 5 is raised higher to the value 6, with the column address remaining at the same value. Thus, after the data element X, the data element Z is addressed as the next character. This substitution of the line address by the column address can also be executed by means of the so called reversing switch. In case that the reversing switch, as shown in FIG. 3, is of the value of 0, for example, this signifies that the line address does not have to be substituted by the column address, with the result that with a successive storage addressing, the storage matrix will be addressed line by line. On the other hand, in case that the reversing switch is of the value 1, as shown in FIG. 4, this signifies that the line address must be substituted by the column address for addressing the storage address, from which follows that by successive addressing of the storage matrix, it will be addressed column by column.

Figure 5:
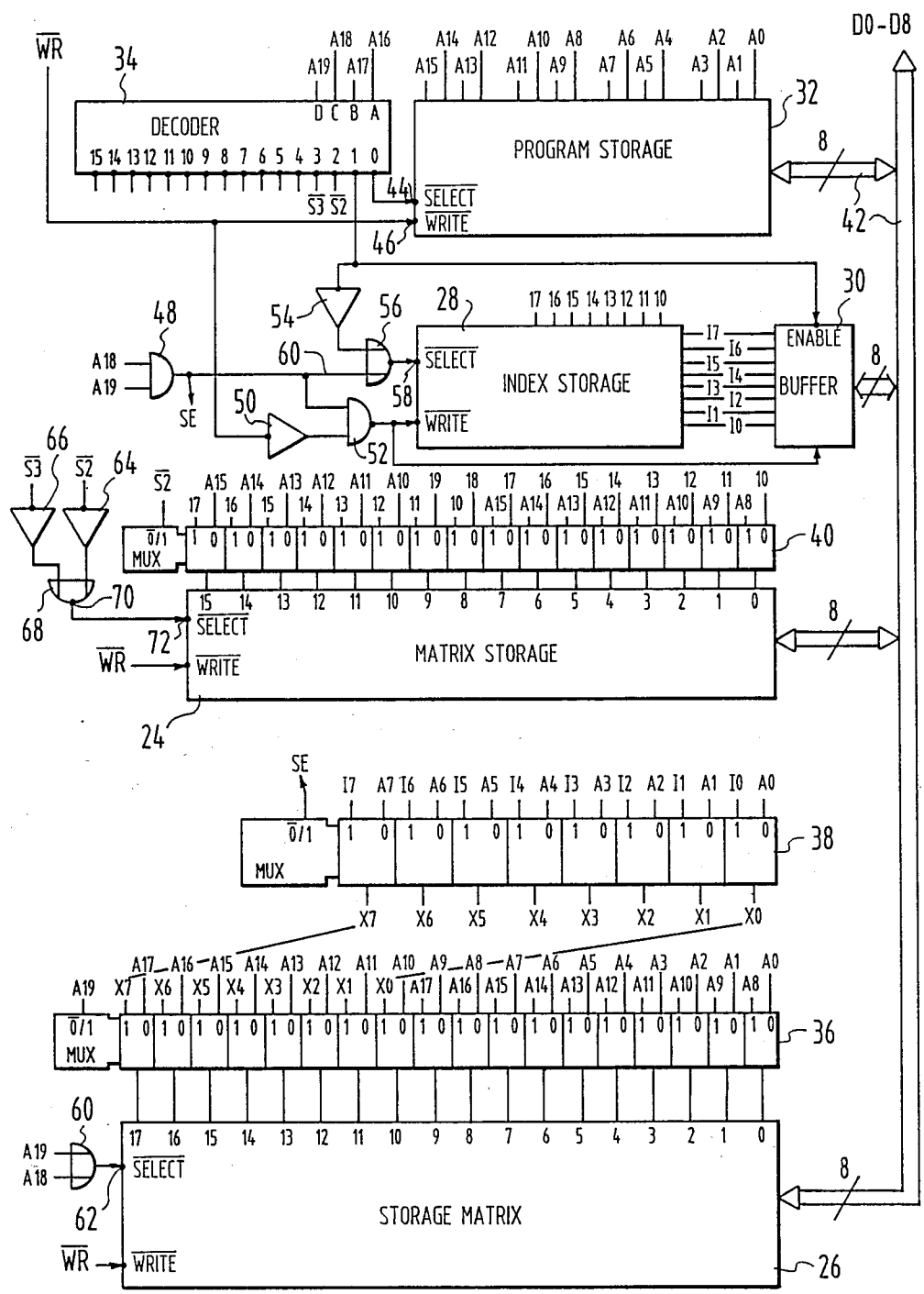
FIG. 5 is a circuit plan of a storage system.

FIG. 5 illustrates a block diagram of a storage system that is especially suitable for executing of the process according to the invention. This storage system contains basically a matrix storage 24, a storage matrix 6, an index storage 28, connected with a data buffer 30, a program storage 32, a 1 among 16 decoder 34, a first multiplexer 36, a second multiplexer 38 and a third multiplexer 40. In order to understand the design and the way of operation of this storage system, it is first necessary to indicate the outlay of this storage system. This will be explained in the following, according to FIG. 6 in connection with FIG. 5.

Figure 6:
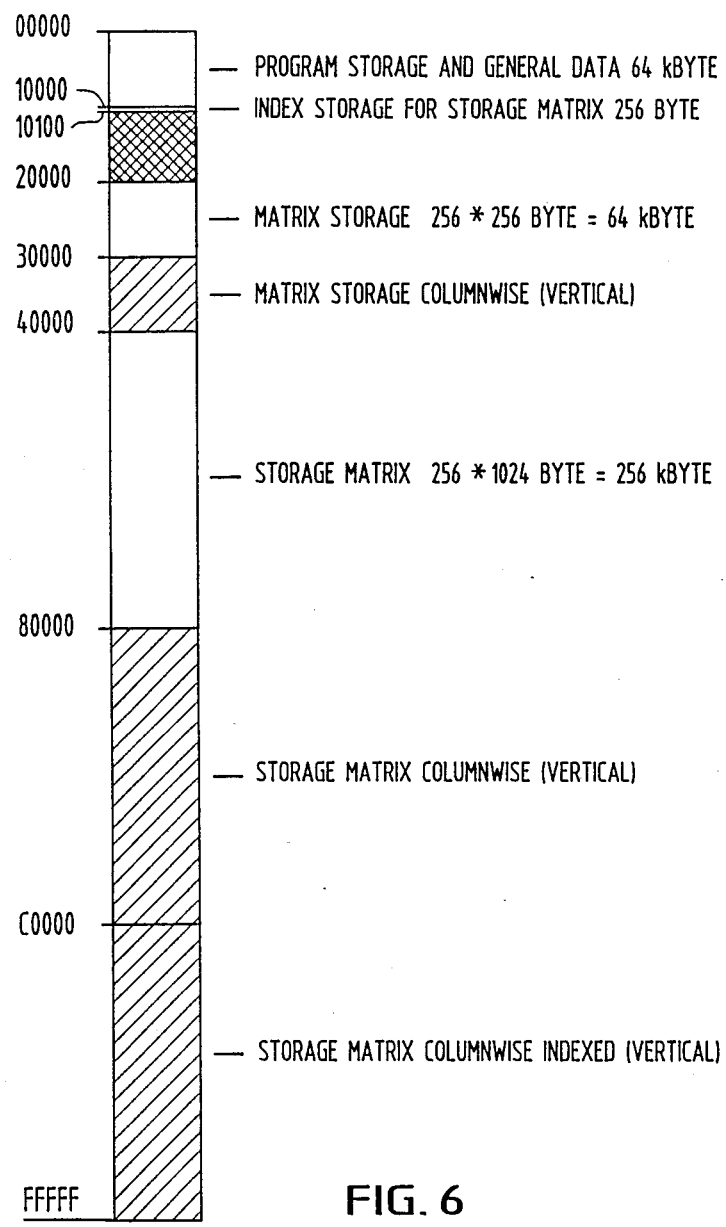
FIG. 6 is an addressing diagram of the storage system of FIG. 5.

The range of addressing 00000 to 0FFFF is assigned to the 64K byte program storage 32. The address range 10000 to 100FF serves for addressing the 256 bytes of the index storage 28. The addressing 10100 to 1FFFF are not used in this storage system. The address range 200000 to 2FFFF serves for addressing the 64K bytes comprising matrix storage 24 line by line. The address range 30000 to 3FFFF serves for addressing matrix storage 24 column by column. Finally, the storage range 40000 to FFFFF is assigned to storage matrix 26. The 256K bytes of this storage matrix 26 are to be addressed line by line when in the address range 40000 to 7FFFF. They are further addressable column by column in the address range 80000 to BFFFF. In the address range C0000 to FFFFF, they are additionally indexed column by column, i.e. they are addressably assorted. Since in this storage system the matrix storage 24 and the storage matrix 26 are repeatedly differently addressable, the virtual storage range of the storage system is clearly larger than the bodily available storage range. While the latter is illustrated in FIG. 6 as not hatched, the virtual storage range is shown simply hatched. The crosswise hatched storage range is not used for this storage system.

Therefore, the storage system shown in FIG. 5 has, including the reversing switch for the various types of addressing, an address range of 1 Megabyte. 20 bits are necessary for the selection of the address, i.e. 20 address lines A0 to A19, in order to be able to address with a writing or reading access a byte as the smallest storage unit. The data lines are so called bidirectional lines, i.e. the information comes in reading operations from the storage system. In writing operations, on the other hand, it is led by these lines (conduits) into the storage system. The signal WR controls the storage operations READING and WRITING. While this signal is logically 0 when the operation WRITING is executed, the signals are logically 1 when they are active. Storage modules (building blocks) can be used for the design of this storage system.

The function of this storage system is more specifically explained in the following. The selection of the program storage 32 is made when the addresses A16 to A19 are logic 0. That is determined by the 1 of 16 decoder 34. Its outputs are logic 1 in inactive state, while in active state they are logic 0. When thus the address bits A16 to A19 which are adjacent at the input of the decoder are logic 0, then at the output "0" of the decoder 34 appears the signal logic 0 that controls the select input 44 of the program storage 32. Since the select input 44 is a negative input, the program storage 32 is selected when the signal is logic 0. As already mentioned above, the same is valid for the input $\overline{\text{WRITE}}$ 46, i.e. when the signal $\overline{\text{WR}}$ is logic 0, writing will take place in this storage range. On the other hand, when this signal is logic 1, it will be read from this storage range and the information signals are connected to the data bus. Since the storage matrix 26 (address range 40000 to FFFFF) with the address bits A18 and A19 can be unequivocally selected, the outputs 4 to 15 are not used in the decoder 34.

The index storage 28 is selected in the address range 10000 to 100FF in reading operation, as well as in writing operation, and also for the indexed addressing of the storage matrix 26 within the address range C0000 to FFFFF in reading operations only. In the last address range, a write-in into the index storage 28 is prevented by the logic linkage of the signal $\overline{\text{WR}}$ with the address signals A18 and A19 by an AND member 48, an inverter 50 and a NAND member 52. For the selection of the index storage 28, the signal of the outlet "1" of the decoder 34 is led through an inverter 54 into a NOR member 56, the output signal of which controls the select input 58 of the index storage 28. The selection of this index storage 28 takes place for the address range C0000 to FFFFF not by means of the decoder 34 but directly by means of the address signals A18 and A19.

Both these signals are interlinked by means of the AND member 48, the output 60 of which is connected with the NOR member 56. The index storage 28 must have a very short access time, since the data of this storage become necessary within a storage cycle for the address of the storage matrix 26.

Since the index storage 28 is written upon only in the address range 10000 to 100FF and not in the address range C0000 to FFFFF, the data buffer 30 is utilized and allows the flow of information from the data line 42 to the index storage 28 in the address range 10000 to 100FF. The control of this data buffer 30 is provided by the signal occurring on the output 1 of the decoder 34, as well as by the signal $\overline{\text{WR}}$.

The storage matrix 26 consists of 256 lines per 1024 bytes, which results in a storage range of 256K bytes. For addressing the 256 lines, a line address of 8 bit length, and for addressing the 1024 columns, a column address of 10 bit length are necessary. That results for this storage matrix 26 in an 18 bit address. Since this storage matrix 26 for the address range of 40000 to 7FFFF is addressed line by line, and for the address range 80000 to FFFFF is addressed column by column and indexed addressed column by column, the address signal of the highest value A19 for controlling the first multiplexer 36 can be applied. When the address signal A19 is 0, the 0 inputs of the multiplexer are used. No substitution of line and column addresses takes place in this case, so that the storage range is addressed line by line. On the other hand, when the address signal A19 is 1, the inputs of the multiplexer 36 are connected to the storage matrix 26 in a manner resulting in a substitution of line and column addresses. The address signals A8 to A17 are then led to the column address and the signals X0 to X7 to the line address. The selection of these address signals for storage matrix 26 takes place when at least one of both address signals A18 and A19 is active. They are therefore disjunctively interlinked by an OR-member 60, the output signal of which controls the select-input 62 of the storage matrix 26.

The signals X0 to X7 stem from the second multiplexer 38. With this it is possible to obtain a switchover from the address signals A0 to A7 to the output signals 10 to 17 of the index storage 28. The switchover is necessary when the storage matrix 26 has to be index addressed by column. Should this result for the storage range C0000 to FFFFF, the switchover must follow when both peak value address signals A19 and A18 are simultaneously 1, i.e. when the signal SE is 1 at the output of the AND-member 48.

Since the storage range 20000 to 3FFFF is assigned to the matrix storage 24, the selection of this matrix storage 24 ensues with the signals of the $\overline{\text{S2}}$ and $\overline{\text{S3}}$ of the decoder 34. These signals are inverted by the inverters 4 and 66, respectively, and then linked by a NOR member 8, the output of which is connected with the select input 72 of the matrix storage 24. This encompasses a storage range of 256×256 bytes=64K bytes. Therefore, for its addressing, only a 16 bit address is necessary, consisting of an 8 bit line (row) and an 8 bit column address. This 16 bit address is led to the matrix storage 24 from the third multiplexer 40. The control of this multiplexer 40 ensues by the signal $\overline{\text{S2}}$ from the decoder 34. When this signal is logic 0, the 0 inputs of the multiplexer 40 are used for forming the 16 bit address of the matrix storage 24. These 0 inputs are actuated by the address bits A0 to A15 in the ascending normal address sequence. In the 1 inputs of the multiplexer 40, the column and line address bits of the matrix storage 24 are arranged interchanged. In this case, the address A8 to A15 is the column address, while the address A0 to A7 represents the line address. By switching over the address by the multiplexer 40, it is possible to address the matrix storage 24 line by line, as well as column by column. The matrix storage 24 serves in this execution of the above described process as an attribute and descriptor storage.

Figure 7:
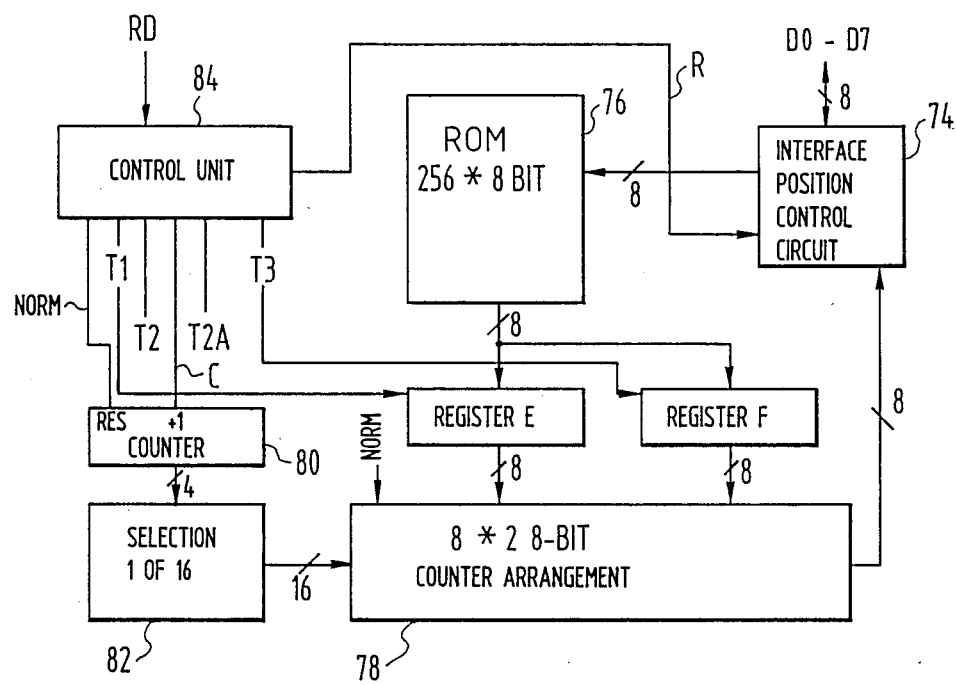
FIG. 7 is an indicator system for classification of the data structure of a data element sequence.

FIG. 7 shows an indicator system for the classification of the data structure of a line of data elements. It consists of an interface control circuit 74 that controls the bidirectional data traffic, a read only (ROM) storage 76 to which a register E and a register F are connected in parallel. A counter arrangement 78 is connected with the outputs of these registers, comprising ($8 \times 2$) 8 bit individual counters. A 1 of 16 select circuit 82 is controlled by a further counter 80 having a 4 bit output. A control unit 84 is provided for controlling these components.

Figure 8:
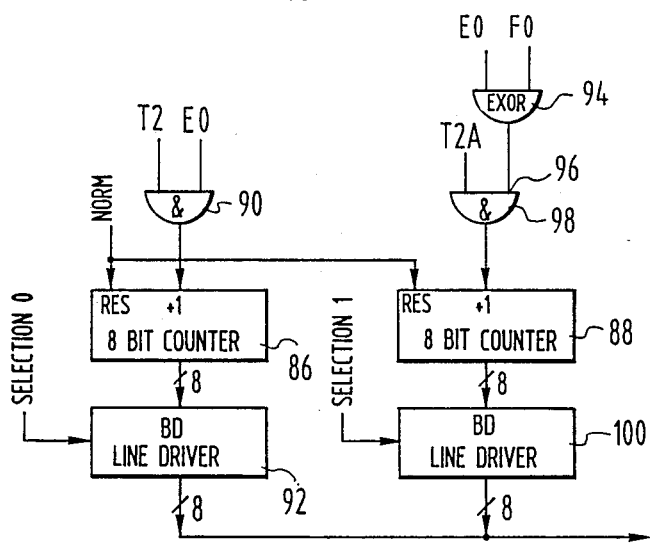
FIG. 8 is a detailed section of a counter arrangement shown in FIG. 7 as a block diagram.

Since the design of this indicator system has been described above, the way in which it functions will be explained in the following, based on FIG. 7 in connection with FIG. 8. First, the data elements, for example of a data element column, are led to the interface control circuit 74. The control unit 84 is activated by the signal RD and emits a takeover of the data elements. These latter serve for addressing the single column read only storage 76 consisting of 256 lines containing the indicator code words. At the beginning of the first cycle for receiving the first indicator code word into the registers E and F, all counters will be reset by the single NORM signal. During a cycle, an indicator code word, corresponding to a data element, is then taken over into the register E by the clock T1. With the clock T3 that follows with a distance of time after the clock T1, the same indicator code word is taken over into the register F. In FIG. 8, the one $2 \times 8$ bit-counter combination of the counter arrangement 78 of FIG. 7 is shown in detail. For each bit of the registers E and F, there are two bit counters foreseen. In this arrangement, the counter 86 counts, for example, how often the bit 0 of the register E is logic 1, and the counter 88 shows the switchover from 0 to 1 or in reverse. This is realized with the counter 86 so that an AND member 90 is series connected with a counter input having on its inputs the signal E0 of the register E and the clock T2. The clock T2 is placed, at the time, between clock T1 and clock T3. In case the bit E0 of the register E has the value 1, the counter 86 is raised by 1 when clock T2 is a logic 1.

The switching from 0 to 1 or in reverse, for example in the bit position 0, is determined by the signals E0 and F0 of the registers E and F. These signals are led to an EXCLUSIVE-OR member 94, the output of which is connected with the input 96 of an AND member 98. The output signal of this AND member 98 controls the counter 88. When the signals E0 and F0 do not correspond, the output signal of the EXCLUSIVE-OR member 94 is logic 1. In this case, the counter is raised by 1 when the clock pulse T2A occurs. The clock pulse T2A occurs between the time of clock T1 and the time of clock T2. Since an indicator code word that is present on the output of the read only (scanning) storage 76 is taken over during the clock pulse T1 into the register E and taken over into the register F when clock pulse T3 occurs, at the time of clock pulse T2A the indicator code word that is available at the output of the read only storage 76 is stored only in the register E. The register F then still maintains that indicator code word which has been read during the directly precedent cycle from the read only storage 76. It can thus be determined, with the help of the counter 88, how often adjacent indicator code words of a data sequence differ at the bit position 0. In this counter arrangement, it is important that the clock pulse T2A is suppressed in the first clock cycle, since the number of bit changes will otherwise be incorrectly counted.

After the interface control circuit 74 has taken over all data elements of a data element line (row), the signals SELECTION 0 to SELECTION 16 will be successively produced by the 1 of 16 selection circuit 82, where the signals SELECTION 0 and SELECTION 1 control both line drivers 92 and 100. First, the count of the counter 86 is passed by the line driver 92 and by the interface position control circuit 74 to the data bus. After each output of the counter count, the counter 80 will be counted higher by 1 by a signal C produced by the control unit 84. The counter count of the counter 80, raised by 1, serves for selecting the following individual counter of the counter arrangement 78.

Since there are two individual counters available for each bit of the indicator code words as shown in FIG. 8, it is possible to determine for each position of the indicator code words of a data sequence how often the respective bit position is 1 and how often an exchange from 0 to 1 or in the opposite direction takes place. There are thus, altogether, $8 \times 2 = 16$ 8-bit individual counters foreseen. The evaluation of the counter results can be made by means of software, for example.

Figure 9:
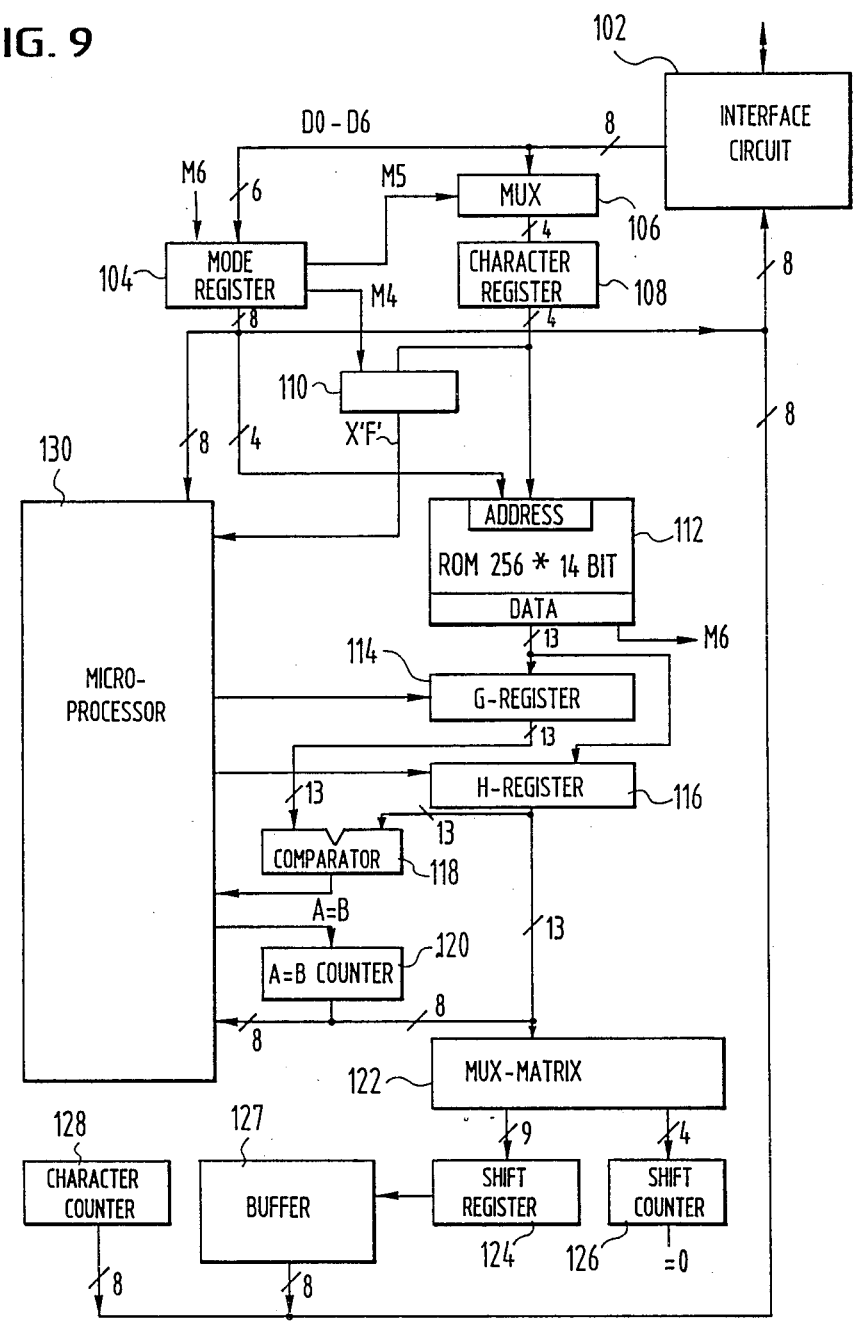
FIG. 9 is a half character compressing device.

FIG. 9 shows the block diagram of a half character compressing device for data words of 8 bit length. It encompasses an interface circuit 102 by which the data transfer and the data control are performed. Connected in parallel with it are a MODUS register 104, on the one side, and a multiplexer 106 with a subsequent character register 108, on the other side. The outputs of the character register 108 are connected with the inputs of recognition circuit 110 for a fill character, for example X'F'. They are further connected to the low value portion of the address inputs of a read only storage memory 112, called in abbreviation a "ROM." The address inputs of higher value of this ROM 112 are connected with the four low value outputs of the MODUS register 104. The ROM 112 altogether is addressable with an 8 bit address and holds thus maximally 256 lines (rows). For each address there are 14 bits stored in the ROM 112. While maximally 9 bits are foreseen for representing the character itself, the number of the valid left justified character bits is coded in the further 4 bits. A bit is also foreseen in case of an error. It sets then the bit M6 of the MODUS register 104. The remaining outputs of ROM 112, having 13 bits, are connected with a G register 114 and with an H register 116. The G register 114 contains the data present just at the output of the ROM 114, and the H register 116 contains the data which was read out as the last ones from the ROM 112. The outputs of both registers 114 and 116 are connected with a 13 bit comparator 118.

Furthermore, a counter 120 is foreseen that will be counted higher in dependence on the result of the comparison of the comparator 118. The outputs of this counter 120 are connected, just as the outputs of the H register 116, with the inputs of a 13 bit multiplexer circuit 122. To this, connected in parallel, is a 9 bit shift register 124, as well as a shift counter 126. The serial output of the shift register 124 is connected with an input of a buffer storage (memory) 127. A character counter 128 is further foreseen and is counted higher by 1 when taking over at any time 8 bits from the shift register 124 into the buffer register 127. The functionally suitable cooperation of the above-mentioned components of the half character compression device is controlled by a microprocessor 130.

The way of functioning of this half character compression system is more specifically explained in the following. When a sequence of 8 bit data words, for example a data element column of a storage matrix, has to be compressed, first of all, the classification result produced for the respective data column is taken over from the above-described indicator system by the interface circuit 102 and written into the MODUS register 104. This MODUS register 104 has 8 bits, from which 6 bits are fed by the signals D0 to D5. The remaining bits are error indications. The bits M0 to M3 serve here for storing the classification result obtained from the indicator system by which the kind of compression is determined. The bit M4 indicates whether a fill character, in this case the half character X'F', has to be suppressed. The bit M5 serves for switching over the data selection, i.e. by bit M5 it will be determined whether in the data words to be consecutively taken over, the bits D0 to D3 or D4-D7 are to be pulled out as half characters which are to be compressed. It indicates when data could not be correctly compressed. The bit M7 remains free.

After loading the MODUS register 104, the data words of the data element column to be compressed are successively taken over by the interface circuit 102 and are led to the multiplexer 106. From this, depending on the MODUS register bit M5, either the data bits D0 to D3 or the data bits D4 to D7 are selected and led to the character register 108. Consecutively, the data bits taken over from the character register 108 by the recognition circuit 110 for the fill character, in this case for the half character X'F', are checked out. In dependence on the MODUS register bit M4, the taken over 4 bit half character is then suppressed when it is identical to the half character X'F'. The ROM 112 is then taken over by the bits M0 to M3 of the MODUS register 104 as an address portion of higher value, and addressed as a low value address portion by the character register 108. The 4 bits M0 to M3 indicate here how the actual half character has to be converted. Since, on the basis of the 4 bit length of the half characters, only maximally 16 different half characters can occur, 16 lines in ROM 112 are foreseen for each type of compression determined by the 4 bits of higher value of the ROM address in which are contained the compression code words of the half characters for the respective type of compression. Beside the maximal 9 bits for representing the half characters, in ROM 112 there are always 4 further bits foreseen in each line reproducing the number of the valid left justified code word bits. As already mentioned above, the 14th bit is foreseen for the case of an error and sets the MODUS register bit M6.

The G register 114 and the H register 116 are loaded from ROM 112 so that the G-register 114 always contains the last read out value of the ROM 112 and the H register 116 contains the directly before last read value. Both registers 114 and 116 are compared by the comparator 118 after reception of each code word. The counter 120 counts how often both registers 114 and 116 are directly identical successively after having taken over a new code word. With the help of the multiplexer circuit 122, either the content of the H register 116 or the count of the counter 120 is put out (emitted) on the shift register 124 and on the shift counter 126. The microprocessor 130 controls here the multiplexer circuit 122. When the registers 114 and 116 do not coincide several times, the content of the H-register 116 is always led to the shift register 124 and to the shift counter 126. The shift register 124 receives here the maximal 9 bits of the compression code word, and the shift counter 126 receives the valid left justified code word bits of the shift register 124.

On the other hand, when the registers 114 and 116, for example, coincide n times successively, first the contents of the H register 116 are put out with the help of the multiplexer circuit 122 on the shift register 124 and on the shift counter 126. The counting result of the counter 120 of the multiplexer circuit 122, controlled by the microprocessor 130, is led to the multiplexer circuit 122 and recoded by the latter in dependence on the fixed type of compression, determined by the classification result of the indicator system. The shift counter 126 contains, even in this case, the number of the valid left justified bits of the shift register 124. These bits, controlled by the shift counter 126, are put out on the buffer storage 127. The bits, taken over from the former, are counted, and the character counter 128 is raised always by 1 whenever 8 bits are taken over. After compression of all data elements, of the data element column, the buffer storage 127 will be filled by zeros for as long as the stored bit number will amount to an even number multiple of 8 bits. The contents of the buffer storage 127, which contains now the data elements of the data element columns as compression code words, will then be led to the interface storage 102 and then put out (emitted).

The selection signals of the entire compressor, consisting of two half character compression systems, are designed so that both half character compressing systems can work 4 bitwise in parallel. However, the modus adjustment and readout of the results can follow separately.

Figure 10:
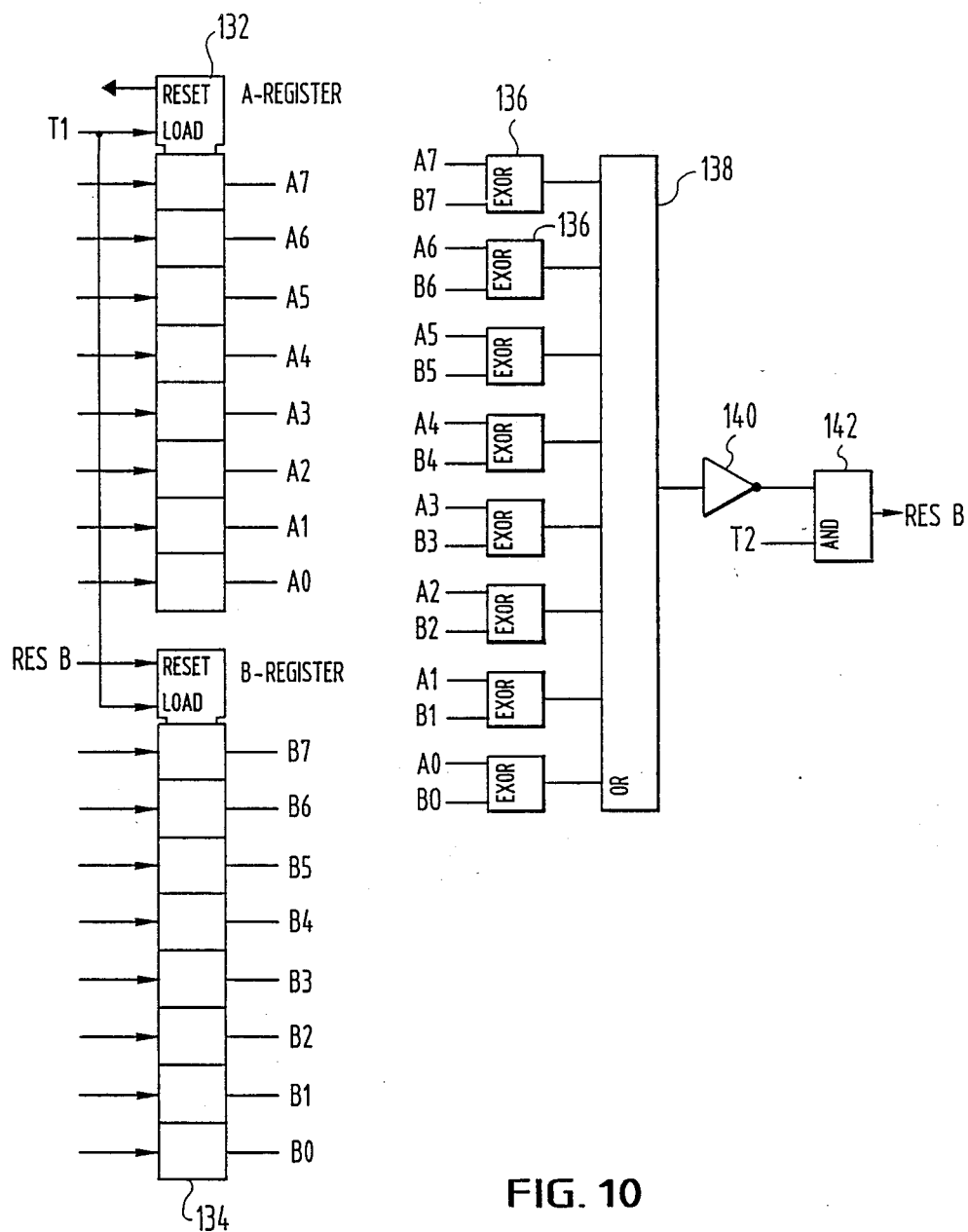
FIG. 10 is a circuit arrangement for logically interlinking data elements.

FIG. 10 shows a circuit arrangement for logic linkage of data elements according to the following truth (Boolean operation) table:

$A \times B = 0$ when $A = B$ $A \times B = B$ when $A \neq B$ on condition that $B \neq 0$, with 0 as a repetition character.

This circuit arrangement consists of an A register 132, a B register 134, an 8 EXCLUSIVE-OR member 136 by which the A register 132 and the B register 134 are interlinked bit by bit, an OR member 138 that links disjunctively the outputs of the 8 EXCLUSIVE-OR members 136, and of an inverter 140 by which the output signal of the OR member 138 is led to an input of the AND member 142. The second input of the AND member 142 is actuated by the clock T2. The B register 134 can be reset by the output signal RES B of the AND member 142.

When 8 bit data elements A and B are logically interlinked according to the above function, they will be loaded with the clock T1 into the A register 132 and into the B register 134. By the bit by bit EXCLUSIVE-OR linkage of the contents of the two registers 132 and 134, a signal logic 0 is obtained on the outputs of those EXCLUSIVE-OR members 136 for which the inputs are identical. When the contents of both registers 132 and 134 are identical in all bit positions, the signal logic 0 appears on all outputs of the EXCLUSIVE-OR members 136, so that on the output of the OR member 138 lies equally the signal logic 0 and consequently, on the output of the inverter 140 is the signal logic 1. The AND-linkage of the logic 1 signal on the output of the inverter 140 with the clock signal T2, effects by the AND member 142 the result that with the clock signal T2 being a logic 1, the signal RES B will also be a logic 1. This signal resets the B register 134 so that it contains zeros on all bit positions.

On the other hand, when the output signal of at least one of the 8 EXCLUSIVE-OR members 136 is logic 1, which is the case when the contents of both registers 132 and 134 do not coincide in at least one bit position, the signal logic 1 then appears at the output of the OR member 138. This signal, after inversion by the inverter 140, is led to the AND member 142. In this case, the signal level logic 0 remains maintained on the output of the AND member 142 when the clock signal T2=1, with the consequence that the B register 134 is not reset and keeps its content.

It should be noted that the various details of the processes and systems described herein as exemplary embodiments in accordance with the invention are not meant to be exhaustive. It will be apparent to those skilled in the relevant arts that other modifications and variations of the above-described illustrative embodiments of the invention can be effected without departing from the spirit and scope of the novel concepts of the invention.

The embodiments of the invention in which an exclusive property or privilege is claimed are defined as follows:

1. Process of compression and expansion of several structurally associated data sequences, including data sequences comprising data sets to be compressed, wherein the data sets to be compressed are stored in parallel in a storage matrix with regard to their structural association for obtaining a number of data elements of the data sequences of linking characteristic for several data sequences, the process comprising the steps of:
   compression of the data sequences by applying codes in substitution and representative of the data elements of coincident ordinal numbers;
   expansion of the data sequences by encoding the codes and obtaining the data elements, and arranging the data elements in data sequences with regard to the respective actual data element ordinal number;
   characterized in that the process further comprises the steps of:
   evaluation of the lengths of the data sequences, prior to performance of the structural analysis;
   formation of data sequence groups comprising data sequences of equal length, prior to performance of the structural analysis; and
   arrangement of the groups of data sequences in accordance with increasing or decreasing length of the sequences, prior to performance of the structural analysis.

2. Process according to claim 1, characterized in that the data sequences of each data sequence group are evaluated as to identity of characteristics and are arranged in accordance with the evaluation.

3. Process according to claim 2, characterized in that storage matrix-line numbers are determined for the arranged data sequences of equal effective length and identical characteristics, and the data sequences are arranged in accordance with increasing or decreasing storage matrix-line numbers.

4. Process according to claim 1, characterized in that an attribute field is generated for each data sequence and completes the corresponding data sequence, with the attribute field containing at least the effective length of the data sequence, a data sequence characteristic and the storage matrix-line number of the corresponding data sequence.

5. Process according to claim 1, characterized in that individual data sequences are serially precompressed.

6. Process according to claim 4, characterized in that the last data element of at least one data sequence, as well as eventually the number of such data elements, representing a repetition factor, is taken over into the attribute field, and that this last data element, as well as the direct precursors coinciding with the last data element, are eliminated for shortening the data sequence.

7. Process according to claim 6, characterized in that the last and the next to last data elements of the unshortened data sequence are taken over as data sequence characteristics into the attribute field and are eliminated in the data sequence.

8. Process according to claim 5, characterized in that at least the longest of the equal data elements consisting of a character string of a data sequence is eliminated and replaced by a fill character, and the character string is inscribed into a descriptor field, provided separately for each data sequence by an index, marking the beginning of the character string by the length of the character string and by the replaced character.

9. Process according to claim 5, characterized in that at least the greatest jittering of interfering characters are ascertained in data sequences to be compressed, fill characters, and the interfering character field is inscribed by a jittering index, marking the beginning of the interfering character by the field length and by the replaced interfering character.

10. Process according to claim 1, characterized in that for each data element column always at least one column descriptor field is generated that inscribes, at least partly, the data element column.

11. Process according to claim 10, characterized in that the data element columns consisting of identical characters are eliminated, replaced by fill characters and inscribed in the respective descriptor fields by indication of the actually replaced character.

12. Process according to claim 11, characterized in that at least the longest character string of a data element column consisting of identical data elements is eliminated and replaced by fill characters, and the character string in the respective column descriptor is inscribed by an index marking the beginning of the character string, by the length of the character string and by the replaced character.

13. Process according to claim 11, characterized in that at least the longest character string of a data element column is recorded in a code word that is shorter in comparison with the respective character string and is replaced by this code word, and the data element places which have been thereby set free are filled with fill characters.

14. Process according to claim 10, characterized in that two adjacent character strings of a data element column are exchanged, and that an index marking the contact place of the character strings in their original position and lengths of the character strings in the descriptor field of the respective data element column are stored.

15. Process according to claim 10, characterized in that the data elements of at least a portion of a data element column are recorded in a code that is less redundant.

16. Process according to claim 10, characterized in that the data elements of a data element column are interlinked by the logical function with the truth table $A \times B = W$, when $A = B$ and $A \times B = B$, when $A \neq B$ on the condition that $B \neq W$, where W is a repetition character.

17. Process according to claim 1, characterized in that each data element of a data element column is coded into an evaluation or indicator code word, the indicator code words of the individual data elements are bit by bit added to a data element column, directly adjacent indicator code words are bit by bit EXCLUSIVE-OR interlinked, the linkage results are added, and both additional results are evaluated for the classification of the data structure.

18. Process according to claim 17, characterized in that each data element column is half characterwise reset into code words determined by the result of classification.

19. Process according to claim 18, characterized in that the classification result is expressed by m-bits, that from the bit classification result, together with as n-bit half character, an (m+n) bit address is formed for addressing a code storage containing the cord words, and that the addressed code words are successively read out from the code storage.

20. Process according to claim 19, characterized in that the two code words last read out from the code storage at any given time are evaluated for equality after each reading cycle of the code storage.

21. Process according to claim 20, characterized in that the number of the directly successive reading cycles of the code storage are counted, after which at any given time the two code words last read out from the code storage will coincide.

22. Process according to claim 21, characterized in that the counter result is coded in dependence on the type of the code words so that the coded counter result is discernible from the respective code words.

23. Process according to claim 18, characterized in that in a data element column preponderantly occurring half characters are represented once, and each one of the remaining half characters, as well as an index, indicating the actual position of this remaining character, is separately represented in the compression code.

24. A data processing system for performing compression and expansion of several structurally associated data sequences, including data sequences comprising data sets to be compressed, the system comprising:
a storage matrix for storing the data sets to be compressed in parallel with regard to their structural association so as to obtain a number of data elements of the data sequences of linking characteristic for several data sequences;
means for compressing the data sequences, including means for applying codes in substitution and representative of the data elements of coincident ordinal numbers;
means for expanding the data sequences by decoding the codes and obtaining the data elements, and arranging the data elements in data sequences with regard to their respective actual data element ordinal number;
characterized in that the data processing system further comprises;
means for evaluating the lengths of the data sequences prior to performance of the structural analysis;
means for forming data sequence groups comprising data sequences of equal length, prior to performance of the structural analysis;
means for arranging the groups of data sequences in accordance with increasing or decreasing length of the sequences, prior to performance of the structural analysis;
address inputs connected to the storage matrix; and
a first switchover device exchangeable in dependence on a first switchover signal, with the line and column addresses of the places of the data element storage.

25. Data processing system according to claim 39, characterized in that the system further comprises an index storage having its number of lines equal to those of the storage matrix and which contains the line address of the storage matrix in an assorted line sequence.

26. Data processing system according to claim 25, characterized in that the system further comprises a second switchover device by which the line address inputs of the storage matrix can be actuated in dependence on a second switchover signal with the outputs of the index storage.

27. Data processing system according to claim 39, characterized in that the system further comprises an attribute and descriptor storage connected on its address inputs with a third switchover device by which, in dependence on a third switchover signal, the line and column addresses of storage places of the storage are exchangeable.

28. Data processing system according to claim 39, characterized in that the system further comprises at least one decoder for obtaining the actual switchover signal from the storage address.

29. Data processing system according to claim 39, characterized in that the actual switchover device is a multiplexer.

30. Data processing system according to claim 39, characterized in that the system further comprises:
means for coding each data element of a data element column into an evaluation or indicator code word;
means for adding, bit by bit, to a data element column the indicator code words of the individual data elements;
means for EXCLUSIVE-OR interlinking, bit by bit, directly adjacent indicator code words;
means for adding the linkage results;
means for evaluating both additional results for the classification of the data structure; and
wherein the system comprises at least one indicator code word containing reading storage and addressable by the data elements.

31. Data processing system according to claim 30, characterized in that the system further comprises a counter arrangement connected with a double number of individual counters in comparison with the bit number of indicator words with a data output of the reading storage and that half of the individual counters have an EXCLUSIVE-OR member series connected, to the inputs of which at any time a bit position of directly adjacent indicator words in the reading storage is admitted.

32. Data processing system according to claim 31, characterized in that between the data output of the reading storage and the inputs of the EXCLUSIVE-OR members the system comprises two registers which serve for intermediate storage of an immediately prior indicator code word read out from the reading storage.

33. Data processing system according to claim 39, characterized in that the system further comprises fixed data storage as code storage that is addressable by a data structure classification result of a data column to be compressed and by an actual half character of the respective data column, where the data structure classification forms an address portion of a higher value and the actual half character forms an address portion of a low value.

34. Data processing system according to claim 33, characterized in that a first and a second register are connected in parallel to the code storage for intermediate storage, at any given time, of the immediately prior and next to immediately prior read code words.

35. Data processing system according to claim 34, characterized in that a comparison circuit that controls a counter is connected with the outputs of the first and of the second register.

36. Data processing system according to claim 24, characterized in that an A register and a B register are provided, serving also as result register, that the outputs of both registers are connected bit by bit with the inputs of the EXCLUSIVE-OR members, and that the outputs of the EXCLUSIVE-OR members are connected with the inputs of a disjunctive linkage member, the output signal of which controls the resetting input of the B register.

37. Data processing system according to claim 35, characterized in that for coding of a counter count of the counter, depending on the kind of code words, a multiplexer circuit is provided, containing the code words to be coded.

* * * * *